(12) United States Patent
Ermert et al.

(10) Patent No.: US 12,173,014 B2
(45) Date of Patent: Dec. 24, 2024

(54) GROUP VI PRECURSOR COMPOUNDS

(71) Applicant: ENTEGRIS, INC., Billerica, MA (US)

(72) Inventors: David M. Ermert, Danbury, CT (US); Thomas H. Baum, New Fairfield, CT (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 18/084,237

(22) Filed: Dec. 19, 2022

(65) Prior Publication Data

US 2023/0124319 A1    Apr. 20, 2023

Related U.S. Application Data

(62) Division of application No. 17/370,722, filed on Jul. 8, 2021, now Pat. No. 11,560,397.

(60) Provisional application No. 63/049,992, filed on Jul. 9, 2020.

(51) Int. Cl.
C07F 11/00      (2006.01)
C23C 16/40      (2006.01)

(52) U.S. Cl.
CPC .......... *C07F 11/005* (2013.01); *C23C 16/405* (2013.01)

(58) Field of Classification Search
None
See application file for complete search history.

(56) References Cited

U.S. PATENT DOCUMENTS

| | | | |
|---|---|---|---|
| 9,115,287 B2 | 8/2015 | Jeong | |
| 2009/0173938 A1 | 7/2009 | Honda | |
| 2018/0294187 A1 | 10/2018 | Thombare | |
| 2019/0368039 A1 | 12/2019 | Arteaga | |
| 2020/0131628 A1 | 4/2020 | Baum | |

FOREIGN PATENT DOCUMENTS

| | | |
|---|---|---|
| CN | 109996803 B | 1/2022 |
| WO | 2016024407 A1 | 2/2016 |

OTHER PUBLICATIONS

Jeyakumar et al., Application of Molybdenum(VI) Dichloride Dioxide (MoO2Cl2) in Organic Transformations, J. Chem. Sci., vol. 121, No. 2, Mar. 2009, pp. 111-123.
Krauss, Hans-Ludwig; About Non-Salt-Like Molybdenum (VI) Complexes; Chemische Berichte, vol. 94, issue 11, pp. 2864-2876; Nov. 1961. (English Abstract Only).
Manwani, N. et al., Synthesis, spectroscopic characterization and structural studies of chloro dioxotriphenylphosphine oxide (O,O-dialkyl/diphenyl(alkylene)dithiophosphate)molybdenum(VI) complexes:crystal structure of MoO2Cl2(OSMe2)2, Inorganica Chimica Acta, 2004, vol. 357, pp. 939-945.
Goldberg et al., Electronic spectra of intermediate charge transfer complexes of CrO2Cl2 in argon matrices, Journal of Molecular Structure, vol. 749, pp. 84-88, 2005.
Matsuzaki et al., Behavior of MoO2Cl2•H2O on Heating, Chemistry Letters, pp. 1219-1222, 1974.
Sengupta et al., Oxalatofluorotungstates(VI) & Oxalatotungstates(VI) of Some Alkali Metals & Complex Cations, Indian Journal of Chemistry, vol. 22A, pp. 535-536, 1983.

*Primary Examiner* — Samantha L Shterengarts
*Assistant Examiner* — Jed A Kucharczk

(57) ABSTRACT

The invention provides a facile process for preparing various Group VI precursor compounds, set forth below as Formula (I), useful in the vapor deposition of certain Group VI metals onto solid substrates, especially microelectronic semiconductor device substrates. Also provided is a process for the preparation of such precursor compounds. Additionally, the invention provides a method for vapor deposition of Group VI metals onto microelectronic device substrates utilizing the precursor compounds of the invention.

12 Claims, 5 Drawing Sheets

GROUP VI PRECURSOR COMPOUNDS

FIELD OF THE INVENTION

The present invention relates to certain precursors for the vapor deposition of Group VI-containing materials and to a method for their preparation.

BACKGROUND OF THE INVENTION

In consequence of its characteristics of extremely high melting point, low coefficient of thermal expansion, low resistivity, and high thermal conductivity, Group VI metals such as molybdenum, chromium, and tungsten are increasingly utilized in the manufacture of semiconductor devices, including use in diffusion barriers, electrodes, photomasks, power electronics substrates, low-resistivity gates, flat-panel displays, and interconnects.

Such utility has motivated efforts to achieve deposition of molybdenum, chromium, and tungsten films for such applications that is characterized by high conformality of the deposited film and high deposition rate to accommodate efficient high-volume manufacturing operations. This in turn has enabled efforts to develop improved molybdenum and tungsten source reagents useful in vapor deposition operations, as well as improved process parameters utilizing such reagents.

However, certain of these precursors are solids at room temperature, and are otherwise challenging to use in vapor deposition processes.

SUMMARY OF THE INVENTION

The invention provides a facile process for preparing various Group VI precursor compounds, set forth below as Formula (I), useful in the vapor deposition of certain Group VI metals onto solid substrates, especially microelectronic semiconductor device and flat panel display substrates. The process provides an effective means to obtain and isolate such materials, which can then be precursor sources of molybdenum, chromium, or tungsten-containing materials to be deposited on such substrates. Additionally, the invention provides a method for vapor deposition of such Group VI metals onto microelectronic device substrates. Certain of the precursor compounds are solvates of the formula $MO_2X_2L_1L_2$, which are useful both as Group VI precursor materials as well as being useful as intermediates in providing compounds of the formula $MO_2X_2$ in a vapor deposition system; in this regard, the formation of such solvates has been surprisingly found to be readily reversible. This feature allows one to prepare a solvate of the Formula (I) below, existing either in solid form or in a solution of the chosen solvent in liquid form, which aids in the physical transport of such precursors within the vapor deposition delivery system, and then provides a precursor-solvate adduct which can then be readily reconverted at a convenient juncture to the precursor of Formula $MO_2X_2$ and utilized in vapor deposition processes.

DETAILED DESCRIPTION OF THE INVENTION

Figure 1:
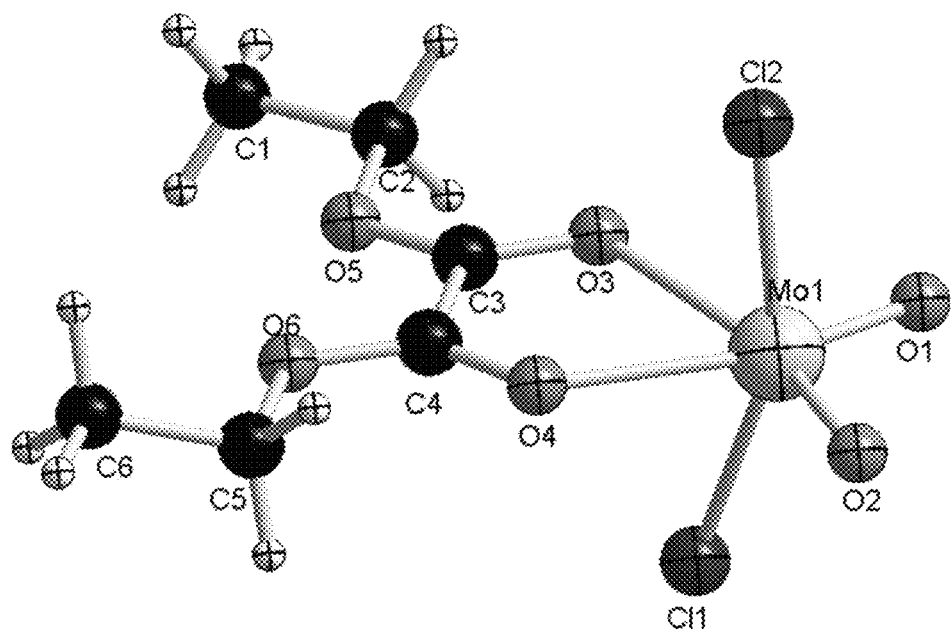
FIG. 1 is a three-dimensional solid-state crystal structure depiction of $MoO_2Cl_2(CH_3CH_2OC(O)C(O)OCH_2CH_3)$.
Figure 2:
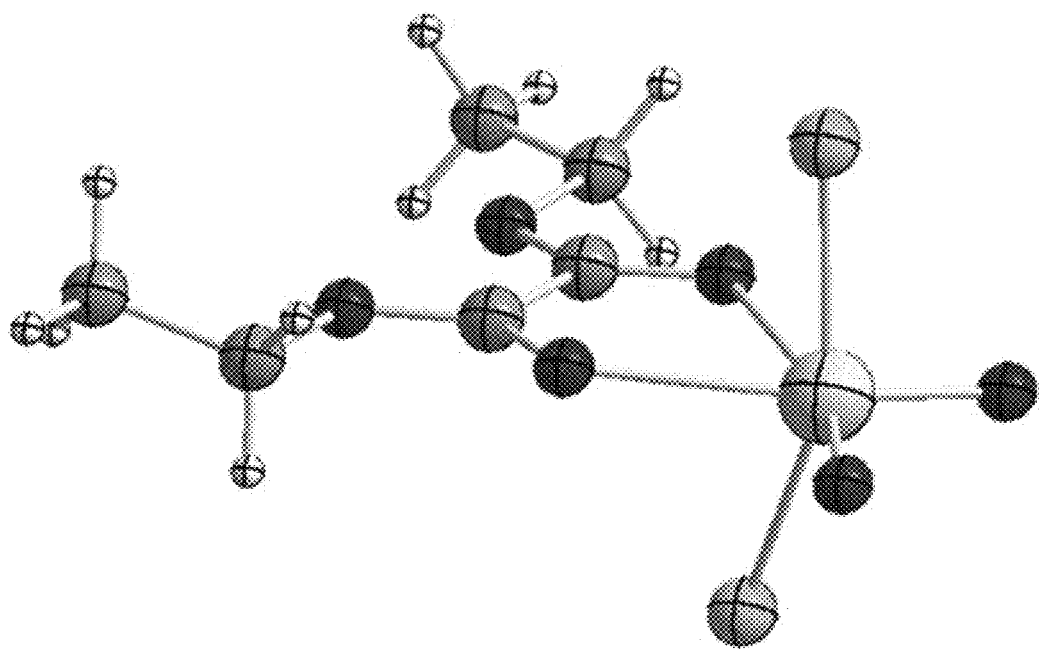
FIG. 2 is a three-dimensional solid-state crystal structure depiction of $MO_2Cl_2(CH_3CH_2OC(O)C(O)OCH_2CH_3)_2$.
Figure 3:
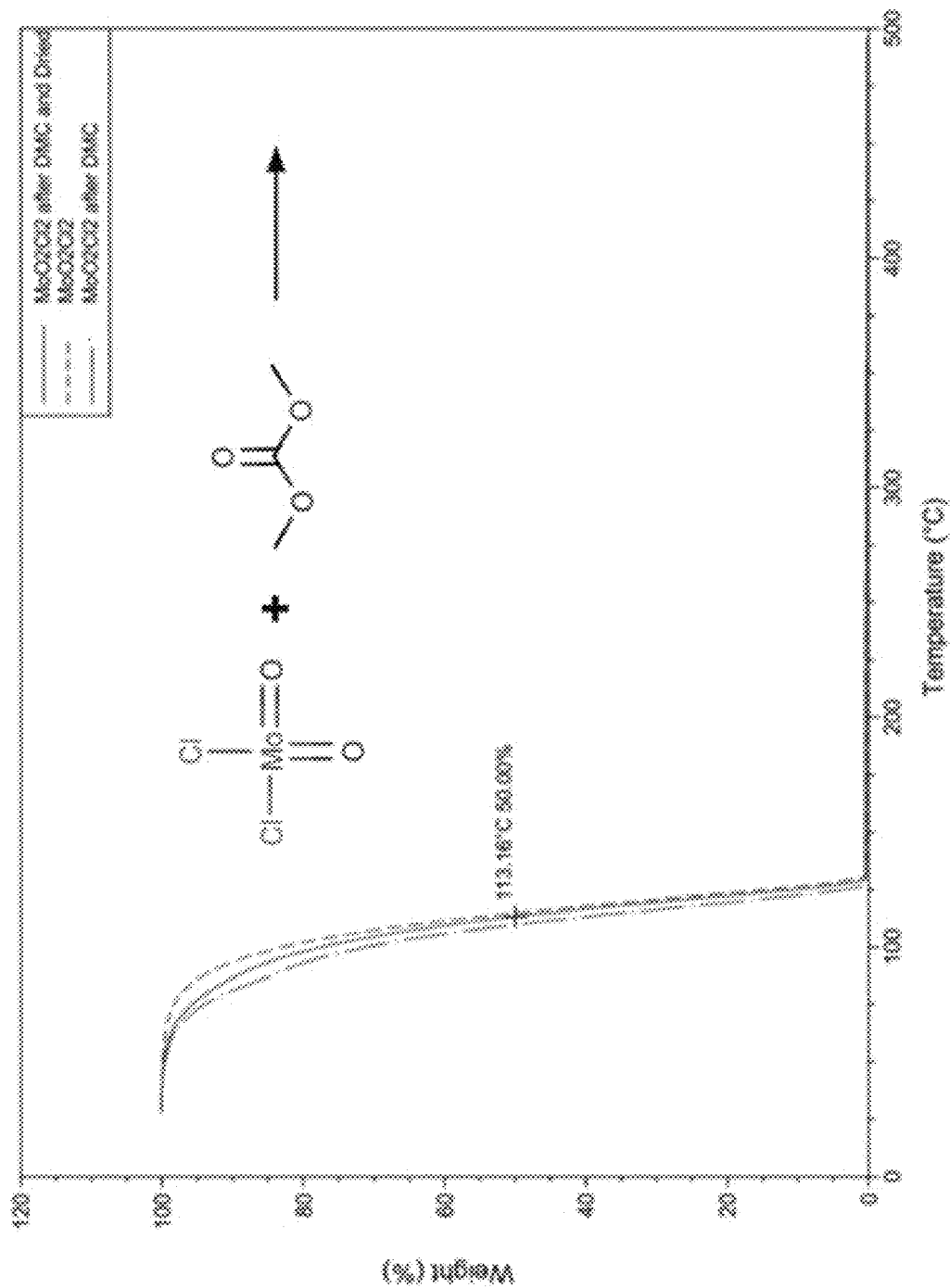
FIG. 3 is a graph of the thermogravimetric analysis comparing (i) $MoO_2Cl_2$, after reaction with dimethyl carbonate followed by drying, (ii) $MoO_2Cl_2$, and (iii) $MoO_2Cl_2$ after treatment with dimethyl carbonate to form the solvate in dimethyl carbonate solution.
Figure 4:
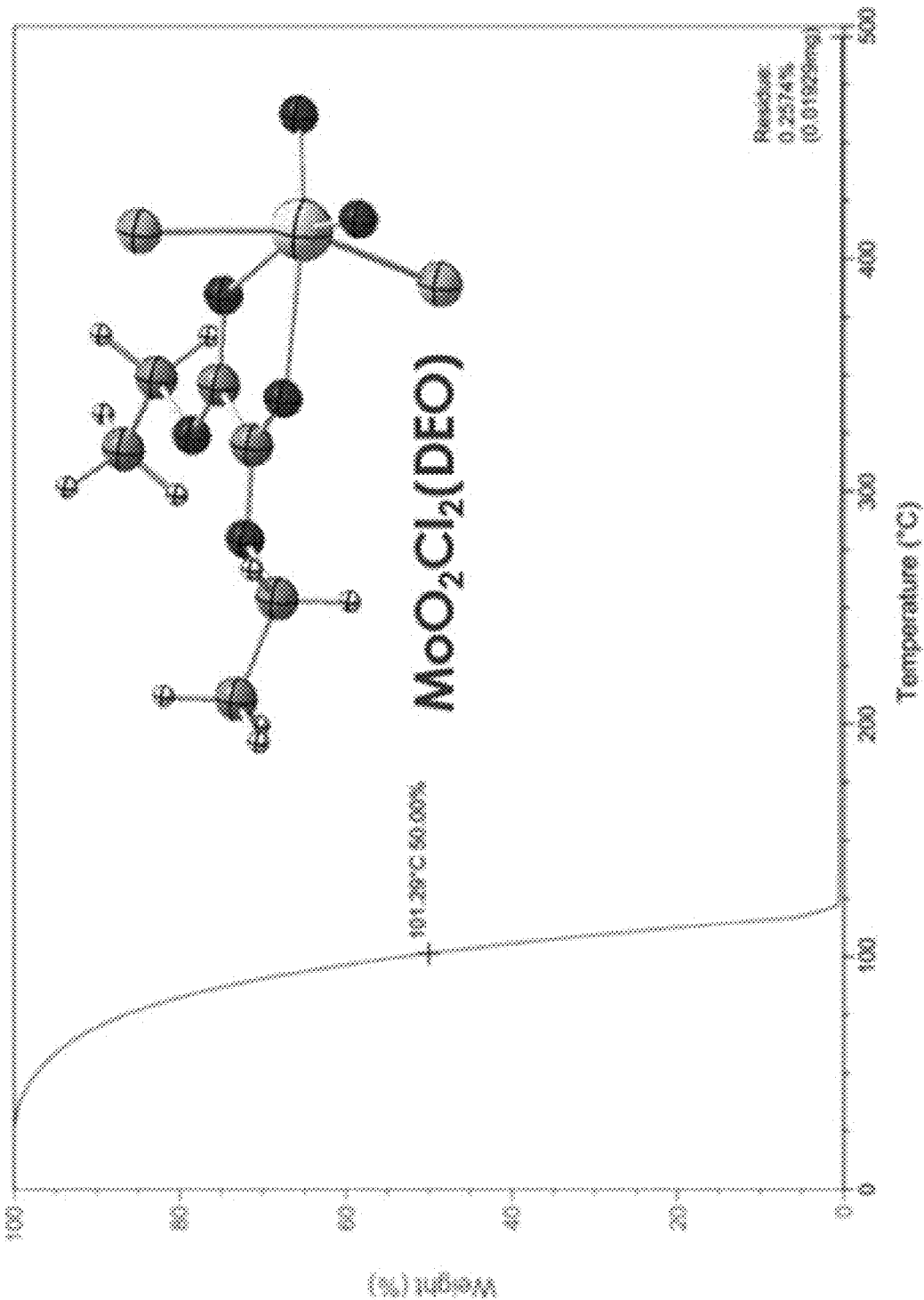
FIG. 4 is a graph of the thermogravimetric analysis of the $MoO_2Cl_2$(diethyl oxalate) adduct.
Figure 5:
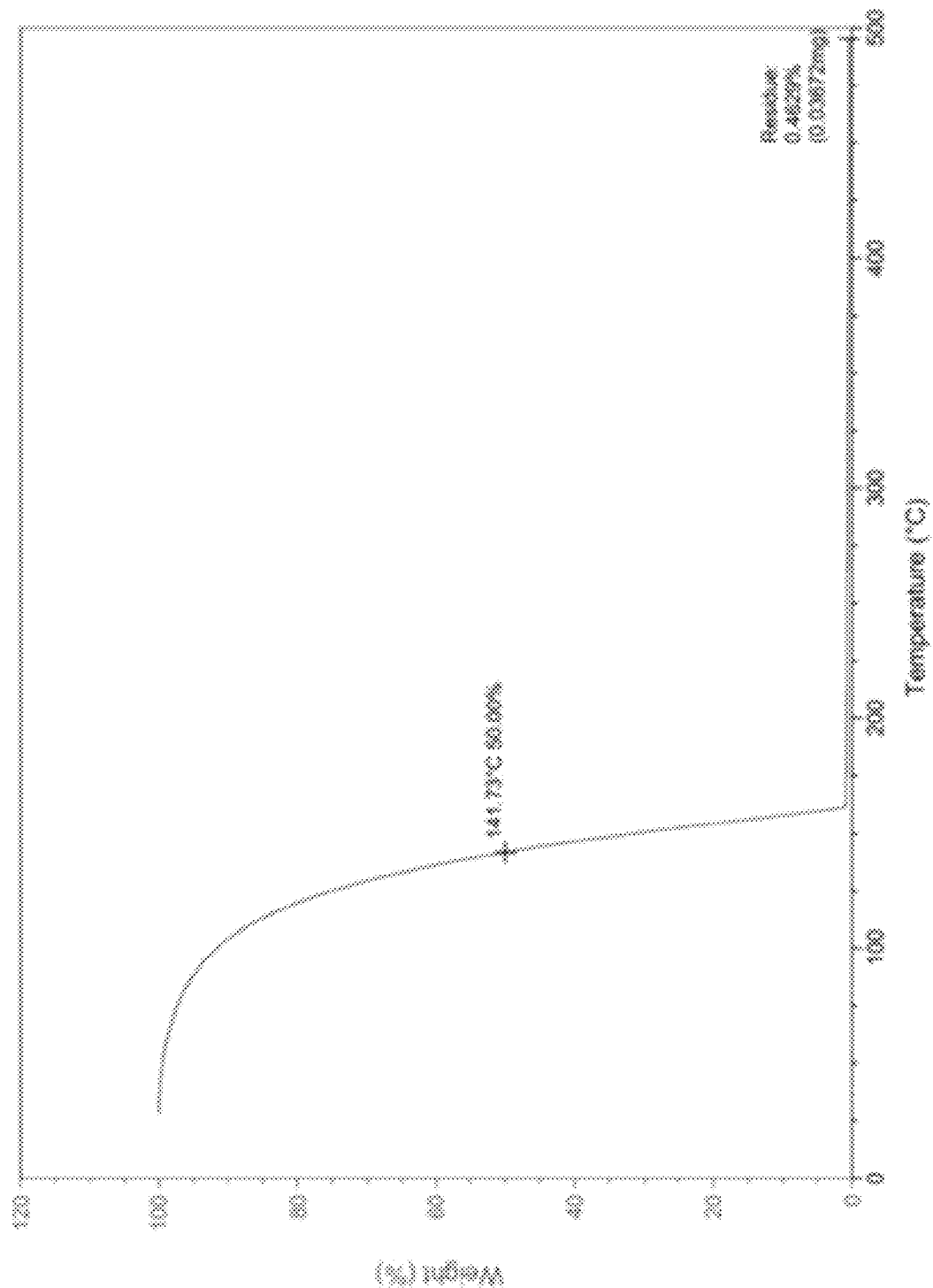
FIG. 5 is a graph of the thermogravimetric analysis of the $MoO_2Cl_2$(propylene carbonate) adduct.

In a first aspect, the invention provides a compound of the Formula (I)

wherein M is chosen from molybdenum, chromium, and tungsten, X is chosen from fluoro, chloro, bromo, and iodo, and each $L_1$ and $L_2$ are the same or different and are chosen from $C_1$-$C_6$ alkyl carbonates and $C_1$-$C_6$ alkyl oxalates.

In one embodiment, the $C_1$-$C_6$ alkyl carbonates include dimethyl carbonate, propylene carbonate, and the like. In another embodiment, the $C_1$-$C_6$ alkyl oxalates include dimethyl oxalate, diethyl oxalate, and the like.

In a second aspect, the invention provides a process for preparing precursors of the Formula (I), which comprises contacting a compound of the formula

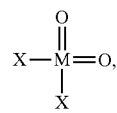

wherein M is chosen from molybdenum, chromium, and tungsten, and X is chosen from fluoro, chloro, bromo, and iodo, with a compound of the formula $L_1$ and/or $L_2$, wherein $L_1$ and $L_2$ are the same or different and are chosen from $C_1$-$C_6$ alkyl carbonates and $C_1$-$C_6$ alkyl oxalates.

In one embodiment, the process is conducted at elevated temperatures, for example from about 20° C. to about 100° C.

It will be appreciated that the structure above depicting the compounds of the invention is drawn in a two-dimensional format, not necessarily representing its three-dimensional orientation.

The invention affords certain compounds which are useful in the vapor deposition of Group VI metals onto various substrates, including microelectronic semiconductor device substrates. Thus, in a third aspect, the invention provides a process for forming a molybdenum, chromium, or tungsten-containing material on a substrate, comprising contacting the substrate with a compound of Formula (I)

wherein M is chosen from molybdenum, chromium, and tungsten, X is chosen from fluoro, chloro, bromo, and iodo, and each $L_1$ and $L_2$ are the same or different are and chosen from $C_1$-$C_6$ alkyl carbonates and $C_1$-$C_6$ alkyl oxalates, and depositing the molybdenum, chromium, or tungsten-containing material onto the substrate, under vapor deposition conditions.

As noted above, the compounds of Formula (I) are useful in their own right as (solid) precursors in the vapor deposition of certain Group VI metals, but they are also useful as intermediates in preparing compounds of the formula $MO_2X_2$, and as such, and given their liquid form while in solution (i.e., with $C_1$-$C_6$ alkyl carbonates and/or $C_1$-$C_6$ alkyl oxalates), are more easily transported within the vapor deposition delivery and re-fill system, and then can be either used as is (solvated form) or readily converted to the underlying compound of the formula $MO_2X_2$ at a desired juncture, by removal of $L_1$ and $L_2$. Accordingly, in a further aspect, the invention provides a process for forming a Group VI metal-containing material on a substrate in a reaction zone, said reaction zone existing within a vapor deposition system having different regions, comprising
 (i) reacting in a first region, a compound of the formula $MO_2X_2$, wherein M is chosen from molybdenum, chromium, and tungsten, and wherein X is chosen from fluoro, chloro, bromo, and iodo, with a with a compound of the formula $L_1$ and/or $L_2$, wherein $L_1$ and $L_2$ are the same or different and are chosen from $C_1$-$C_6$ alkyl carbonates and $C_1$-$C_6$ alkyl oxalates, to provide a compound of Formula (I):

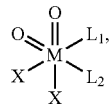

(ii) transporting the compound of Formula (I) to a second region in the vapor deposition delivery and re-fill system;
 (iii) followed by removal of $L_1$ and $L_2$ by application of sufficient heat and/or vacuum to volatilize any solvent present to form a compound of the formula $MO_2X_2$; followed by
 (iv) contacting the substrate with a compound of the formula $MO_2X_2$ in a reaction zone, and depositing Group VI metal-containing material onto the substrate, under vapor deposition conditions.

As noted above, we have found that precursors of the Formula $MO_2X_2$ readily form reversible solvates with $C_1$-$C_6$ alkyl carbonates and $C_1$-$C_6$ alkyl oxalates. The solvates of Formula (I) thus formed can be used in vapor deposition processes as Group VI precursors in an isolated solid form or can be dissolved in the $C_1$-$C_6$ alkyl carbonates and/or $C_1$-$C_6$ alkyl oxalate solvents and used as liquid precursors, whereby such liquid precursors would be delivered to a region adjacent to the vapor deposition reaction zone where any such solvent can be removed, either immediately prior to injection into the vapor deposition reaction zone or as the liquid is being injected into the vapor deposition reaction zone. In one embodiment, the liquid is flash vaporized as the compound shown in Formula (I). In another embodiment, the solvent is removed from the liquid source of Formula (I), leaving $MO_2X_2$, as a pure solid. In this regard, given the challenges accompanying handling and otherwise utilizing a solid form of precursors of the formula $MO_2X_2$, the solution of the compound of Formula (I) in $C_1$-$C_6$ alkyl carbonates and/or $C_1$-$C_6$ alkyl oxalates can be administered to a zone of the vapor deposition system prior to injecting same to a reaction zone where the vapor deposition takes place, either with or without removal of the $C_1$-$C_6$ alkyl carbonate or $C_1$-$C_6$ alkyl oxalate solvent(s).

In a further embodiment, a solid precursor of the formula $MO_2X_2$ can be utilized in conjunction with a vapor deposition system with a source of $C_1$-$C_6$ alkyl carbonates and/or $C_1$-$C_6$ alkyl oxalates nearby adjacent thereto, which can then be utilized to solubilize the solid precursor of the formula $MO_2X_2$, thus forming a liquid form of the compound of Formula (I) in the $C_1$-$C_6$ alkyl carbonates and/or $C_1$-$C_6$ alkyl oxalates solvent. In this regard, we believe that solutions of at least about 1 Molar concentrations of Formula (I) can be formed in such $C_1$-$C_6$ alkyl carbonate and/or $C_1$-$C_6$ alkyl oxalate solvents, thus being efficacious for use as a liquid precursor source for Group VI metals.

In certain embodiments of the invention, the precursor can used in conjunction with pulsed vapor deposition conditions. It is expected that this will improve step coverage of the deposition. Suitably, the "pulse" and "purge" time of pulsed deposition may each independently be in the range of from 1 to 120 seconds, 1 to 60 seconds, or 1 to 20 seconds, depending on the substrate structure and reactor design.

In various embodiments, the vapor deposition conditions comprise an inert atmosphere, save for the optional presence of a reducing agent such as hydrogen. In certain embodiments, the precursor vapor may be deposited in the substantial absence of other metal vapors.

The process of the present invention may comprise volatilizing the compounds of Formula (I) or $MO_2X_2$ vapor, (for example, molybdenum dioxydichloride ($MoO_2Cl_2$) to form the molybdenum dioxydichloride ($MoO_2Cl_2$) vapor) for the vapor deposition operation. The vapor deposition conditions may be of any suitable type, and may for example comprise a reducing ambient (vapor) such as hydrogen gas so that the Group VI-containing material comprises elemental Group VI metal material in the deposited film.

The Group VI metal-containing material so deposited may comprise, or alternatively consist, or consist essentially of, elemental Group VI metals such as molybdenum, or molybdenum oxide, or other molybdenum-containing material. Depending on the level of reducing agent, e.g., hydrogen concentration, it is possible to preferentially deposit greater proportions of elemental Group VI metal versus the Group VI metal oxide.

In one embodiment, the Group VI-containing layer deposited on the substrate surface may for example be formed by pulsed chemical vapor deposition (CVD) or atomic layer deposition (ALD) or other (thermal) vapor deposition technique, without the prior formation of a nucleation layer and thus directly with $MO_2X_2$ or $MO_2X_2L_1L_2$ vapor. The respective precursor vapor contacting steps may be carried out alternatingly and repetitively for as many cycles as are desired to form the desired thickness of the Group VI metal-containing film. In various embodiments, the contact of the substrate (e.g., titanium nitride) layer with the compounds of Formula (I) or $MO_2X_2$ vapor is conducted at temperature in a range of from 300° C. to 750° C. for vapor deposition.

With such precursor vapor, the Group VI metal-containing material can be deposited directly onto the substrate, to form a bulk deposit of elemental Group VI metal or metal oxide or other Group VI-containing compound or composition (i.e., MN) The concentration of $H_2$ is critical towards the formation of Group VI metal vs. oxide, as greater than four molar equivalents or an excess of $H_2$ is required for metal formation. Less than four (4) molar equivalents of $H_2$ will result in the formation of varying amounts of an oxide of the Group VI metal, and thus will require further exposure to $H_2$ in order to reduce the Group VI metal oxide thus formed.

The process chemistry for depositing such Group VI metal-containing materials in accordance with the present disclosure may include deposition of elemental molybdenum, Mo(0), by the reaction $2MoO_2Cl_2+6H_2 \rightarrow 2Mo+4HCl+4H_2O$. Intermediary reactions may be present and are well known in the art.

The Group VI metal-containing material deposited in accordance with the method of the present invention may be characterized by any appropriate evaluation metrics and parameters, such as deposition rate of the Group VI metal-containing material, film resistivity of the deposited Group VI metal-containing material, film morphology of the deposited Group VI metal-containing material, film stress of the deposited Group VI metal-containing material, step coverage of the material, film composition and purity, and the process window or process envelope of appropriate process conditions. Any appropriate evaluation metrics and parameters may be employed, to characterize the deposited material and correlate same to specific process conditions, to enable mass production of corresponding semiconductor products and flat panel displays. Advantageously, the process of the invention is believed to be capable of depositing a film of high purity Group VI metal onto a semiconductor device.

In certain embodiments, the invention relates to a method of forming a Group VI metal-containing material on a substrate, comprising depositing such metals on the substrate surface by a chemical vapor deposition (CVD) process utilizing precursors described above, to produce the Group VI metal-containing material on the substrate. In one embodiment, the Group VI metal is molybdenum.

The substrate utilized in the deposition process of the invention may be of any suitable type, and may for example comprise a semiconductor device substrate, e.g., a silicon substrate, a silicon dioxide substrate, or other silicon-based substrate. In various embodiments, the substrate may comprise one or more metallic or dielectric substrates, for example, Co, Cu, Al, W, WN, WC, TiN, Mo, MoC, $SiO_2$, W, SiN, WCN, $Al_2O_3$, AlN, $ZrO_2$, $HfO_2$, $SiO_2$, lanthanum oxide ($La_2O_3$), tantalum nitride (TaN), ruthenium oxide ($RuO_2$), iridium oxide ($IrO_2$), niobium oxide ($Nb_2O_3$), and yttrium oxide ($Y_2O_3$).

In certain embodiments, for example in the case of an oxide substrate such as silicon dioxide, or alternatively a silicon or polysilicon substrate, the substrate may be processed or fabricated to include a barrier layer thereon, e.g., titanium nitride, for subsequently deposited material.

In one embodiment, the molybdenum, chromium, or tungsten-containing layer deposited on the substrate surface may for example be formed by pulsed chemical vapor deposition (CVD) or atomic layer deposition (ALD) or other vapor deposition technique, without the prior formation of a nucleation layer and thus directly with vapor derived from the compounds of Formula (I) or from compounds of the Formula $MO_2X_2$, which are obtained from the compounds of Formula (I).

With vapor derived from compounds of Formula (I), the Group VI metal-containing material can be deposited directly onto the substrate to form a bulk deposit of elemental molybdenum, chromium, or tungsten or their corresponding oxides. With the addition of $NH_3$ as a co-reactant, the formation of MN can also be realized.

In another embodiment, an oxidizing co-reactant such as oxygen may be added to the process when using the precursors as described herein as a means of depositing a metal oxide thin film, such as $MoO_2$, $WO_3$, or $Cr_2O_3$.

In one aspect is described, a process for forming a molybdenum, chromium, or tungsten-containing material on a substrate, comprising contacting the substrate with a compound of Formula $MO_2X_2(L)$, wherein M is chosen from molybdenum, chromium, and tungsten, X is chosen from fluoro, chloro, bromo, and iodo, and L is a $C_1$-$C_6$ alkyl oxalate, and depositing the molybdenum, chromium, or tungsten-containing material onto the substrate, under vapor deposition conditions.

In a second aspect is described, a process for forming a Group VI metal-containing material on a substrate in a reaction zone, said reaction zone existing within a vapor deposition system having different regions, comprising:
1. reacting in a first region, a compound of the formula $MO_2X_2$, wherein M is chosen from molybdenum, chromium, and tungsten, and wherein X is chosen from fluoro, chloro, bromo, and iodo, with a with a compound of the formula L is a $C_1$-$C_6$ alkyl oxalate, to provide a compound of Formula $MO_2X_2(L)$,
2. transporting the compound of Formula $MO_2X_2(L)$ to a second region in the vapor deposition delivery and re-fill system;
3. followed by removal of L by application of sufficient heat and/or vacuum to volatilize any solvent present to form a compound of the Formula $MO_2X_2$; followed by
4. contacting the substrate with a compound of the formula $MO_2X_2$ in a reaction zone, and depositing Group VI metal-containing material onto the substrate, under vapor deposition conditions.

In a third aspect, a process of aspect two, wherein the compound of Formula $MO_2X_2(L)$ is isolated in solid form prior to being transported to either the second region or the reaction zone.

In a fourth aspect, a process of aspect two, wherein the compound of Formula $MO_2X_2(L)$ is dissolved in a solvent chosen from $C_1$-$C_6$ alkyl carbonates and $C_1$-$C_6$ alkyl oxalates.

In a fifth aspect, a process of aspect two, wherein the compound of Formula $MO_2X_2(L)$ is injected by liquid delivery into a heated zone for flash vaporization of the compound of Formula $MO_2X_2(L)$ and used to deposit a film onto a heated substrate in the reaction zone.

In a sixth aspect, a process of aspect two, wherein the compound of Formula $MO_2X_2(L)$ is injected by liquid delivery metering directly onto a heated substrate in the reaction zone.

It will be appreciated that the method of the present invention may be carried out in numerous alternative ways, and under a wide variety of process conditions. The process of the invention may for example be carried out in a process for making a semiconductor device on the substrate. The semiconductor device may be of any suitable type, and may for example comprise a DRAM device, 3-D NAND device, or other device or device integrated structure. In various embodiments, the substrate may comprise a via in which the Group VI metal-containing material is deposited. The device may, for example, have an aspect ratio of depth to lateral dimension that is in a range of from 10:1 to 40:1. In other embodiments, the method may be carried out in the manufacture of a semiconductor device product, such as a mobile device, a logic device, a flat-panel display, or an IC packaging component.

The invention has been described in detail with particular reference to certain embodiments thereof, but it will be understood that variations and modifications can be effected within the spirit and scope of the invention.

The invention claimed is:

1. A process for forming a molybdenum, chromium, or tungsten-containing material on a substrate, comprising contacting the substrate with a compound of Formula (I)

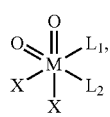

(I)

wherein M is chosen from molybdenum, chromium, and tungsten, X is chosen from fluoro, chloro, bromo, and iodo, and each $L_1$ and $L_2$ are the same or different and are chosen from $C_1$-$C_6$ alkyl carbonates, and depositing the molybdenum, chromium, or tungsten-containing material onto the substrate, under vapor deposition conditions.

2. A process for forming a Group VI metal-containing material on a substrate in a reaction zone, said reaction zone existing within a vapor deposition system having different regions, comprising
(i) reacting in a first region, a compound of the formula $MO_2X_2$, wherein M is chosen from molybdenum, chromium, and tungsten, and wherein X is chosen B from fluoro, chloro, bromo, and iodo, with a compound of the formula $L_1$ and/or $L_2$, wherein $L_1$ and $L_2$ are the same or different and are chosen from $C_1$-$C_6$ alkyl carbonates, to provide a compound of Formula (I):

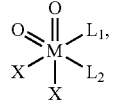

(ii) transporting the compound of Formula (I) to a second region in the vapor deposition delivery and re-fill system;
(iii) followed by removal of $L_1$ and $L_2$ by application of sufficient heat and/or vacuum to volatilize any solvent present to form a compound of the Formula $MO_2X_2$; followed by
(iv) contacting the substrate with a compound of the formula $MO_2X_2$ in a reaction zone, and depositing Group VI metal-containing material onto the substrate, under vapor deposition conditions.

3. The process of claim 2, wherein the compound of Formula (I) is isolated in solid form prior to being transported to either the second region or the reaction zone.

4. The process of claim 2, wherein the compound of Formula (I) is dissolved in a solvent chosen from $C_1$-$C_6$ alkyl carbonates and $C_1$-$C_6$ alkyl oxalates.

5. The process of claim 2, wherein the compound of Formula (I) is injected by liquid delivery into a heated zone for flash vaporization of the compound of Formula (I) and used to deposit a film onto a heated substrate in the reaction zone.

6. The process of claim 2, wherein the compound of Formula (I) is injected by liquid delivery metering directly onto a heated substrate in the reaction zone.

7. A process for forming a molybdenum, chromium, or tungsten-containing material on a substrate, comprising contacting the substrate with a compound of Formula $MO_2X_2$ (L),
wherein M is chosen from molybdenum, chromium, and tungsten, X is chosen from fluoro, chloro, bromo, and iodo, and L is a $C_1$-$C_6$ alkyl oxalate, and depositing the molybdenum, chromium, or tungsten-containing material onto the substrate, under vapor deposition conditions.

8. A process for forming a Group VI metal-containing material on a substrate in a reaction zone, said reaction zone existing within a vapor deposition system having different regions, comprising
reacting in a first region, a compound of the formula $MO_2X_2$, wherein M is chosen from molybdenum, chromium, and tungsten, and wherein X is chosen B from fluoro, chloro, bromo, and iodo, with a compound of the formula L, wherein L is a $C_1$-$C_6$ alkyl oxalate, to provide a compound of Formula $MO_2X_2$(L),
(ii) transporting the compound of Formula $MO_2X_2$(L) to a second region in the vapor deposition delivery and re-fill system;
(iii) followed by removal of L by application of sufficient heat and/or vacuum to volatilize any solvent present to form a compound of the Formula $MO_2X_2$; followed by
(iv) contacting the substrate with a compound of the formula $MO_2X_2$ in a reaction zone, and depositing Group VI metal-containing material onto the substrate, under vapor deposition conditions.

9. The process of claim 8, wherein the compound of Formula $MO_2X_2$(L) is isolated in solid form prior to being transported to either the second region or the reaction zone.

10. The process of claim 8, wherein the compound of Formula $MO_2X_2$(L) is dissolved in a solvent chosen from $C_1$-$C_6$ alkyl carbonates and $C_1$-$C_6$ alkyl oxalates.

11. The process of claim 8, wherein the compound of Formula $MO_2X_2$(L) is injected by liquid delivery into a heated zone for flash vaporization of the compound of Formula $MO_2X_2$(L) and used to deposit a film onto a heated substrate in the reaction zone.

12. The process of claim 8, wherein the compound of Formula $MO_2X_2$(L) is injected by liquid delivery metering directly onto a heated substrate in the reaction zone.

* * * * *